(12) United States Patent
Sutton et al.

(10) Patent No.: US 12,313,790 B2
(45) Date of Patent: May 27, 2025

(54) FOCAL PLANE OPTICAL CONDITIONING FOR INTEGRATED PHOTONICS

(71) Applicant: APPLE INC., Cupertino, CA (US)

(72) Inventors: Andrew J. Sutton, Sunnyvale, CA (US); Robert S. Upton, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 438 days.

(21) Appl. No.: 17/618,503

(22) PCT Filed: Jun. 21, 2020

(86) PCT No.: PCT/US2020/038860
§ 371 (c)(1),
(2) Date: Dec. 13, 2021

(87) PCT Pub. No.: WO2021/029969
PCT Pub. Date: Feb. 18, 2021

(65) Prior Publication Data
US 2022/0236384 A1  Jul. 28, 2022

Related U.S. Application Data

(63) Continuation of application No. 16/752,773, filed on Jan. 27, 2020, now abandoned.
(Continued)

(51) Int. Cl.
*G01S 7/4863* (2020.01)
*G01S 7/481* (2006.01)
(Continued)

(52) U.S. Cl.
CPC .......... *G01S 7/4863* (2013.01); *G01S 7/4815* (2013.01); *G01S 7/484* (2013.01); *G02B 6/1228* (2013.01);
(Continued)

(58) Field of Classification Search
CPC ...... G01S 7/4863; G01S 7/484; G01S 7/4815; H01L 27/14627; H01L 31/0232; G02B 6/1228
See application file for complete search history.

(56) References Cited

U.S. PATENT DOCUMENTS

| | | | |
|---|---|---|---|
| 5,657,408 A | 8/1997 | Ferm et al. | |
| 2004/0076197 A1* | 4/2004 | Clarkson | H01S 3/06708 372/6 |

(Continued)

FOREIGN PATENT DOCUMENTS

DE  19813127 A1 * 10/1998 ............. B23K 26/06

OTHER PUBLICATIONS

International Application # PCT/US2020/038860 Search Report dated Sep. 30, 2020.
(Continued)

*Primary Examiner* — Jennifer D Bennett
*Assistant Examiner* — Erin R Garber
(74) *Attorney, Agent, or Firm* — Meitar Patents Ltd.; Daniel Kligler (57) ABSTRACT

An optical device (20A, 20B, 100, 200, 800) includes a first array of emitters (28A, 28B) disposed on a semiconductor substrate (218) and configured to emit respective beams of optical radiation. A second array (36A, 36B, 224, 808) of micro-optics (34A, 34B, 226, 802) is positioned in alignment with the respective beams of the optical emitters and arranged to condition phases of the beams so that different ones of the beams are transmitted with different phase qualities

8 Claims, 11 Drawing Sheets

Related U.S. Application Data (60) Provisional application No. 62/885,835, filed on Aug. 13, 2019.

(51) Int. Cl.
*G01S 7/484* (2006.01)
*G02B 6/122* (2006.01)
*H10F 39/00* (2025.01)
*H10F 77/40* (2025.01)

(52) U.S. Cl.
CPC .......... *H10F 39/8063* (2025.01); *H10F 77/40* (2025.01)

(56) References Cited

U.S. PATENT DOCUMENTS

| | | | |
|---|---|---|---|
| 2008/0172112 A1* | 7/2008 | Gourgouliatos | A61N 5/0617 607/94 |
| 2009/0015897 A1 | 1/2009 | Nakamura et al. | |
| 2010/0142900 A1 | 6/2010 | Uchida et al. | |
| 2010/0271614 A1 | 10/2010 | Albuquerque et al. | |
| 2014/0313519 A1* | 10/2014 | Shpunt | G01S 17/89 356/612 |
| 2015/0292709 A1* | 10/2015 | Petronius | B23P 11/00 348/222.1 |
| 2019/0196579 A1* | 6/2019 | Shpunt | H01S 5/02253 |
| 2019/0265410 A1* | 8/2019 | Testa | G02B 6/1228 |
| 2020/0367967 A1* | 11/2020 | Lee | G02B 27/0961 |
| 2021/0018602 A1* | 1/2021 | de Mersseman | G01S 7/4812 |

OTHER PUBLICATIONS

CN Application # 202080057432.X Office Action dated Oct. 25, 2024.

* cited by examiner

FOCAL PLANE OPTICAL CONDITIONING FOR INTEGRATED PHOTONICS

FIELD OF THE INVENTION

The present invention relates generally to integrated photonic devices, and specifically to devices and methods for generating an array of optical beams.

BACKGROUND

Integrated photonic devices are devices that combine optoelectronic, optical, and electronic components, typically on a semiconductor substrate. (The terms "optical" and "light," as used in the present description and in the claims, refer to electromagnetic radiation in any of the visible, infrared and ultraviolet ranges of the spectrum.)

SUMMARY

Embodiments of the present invention that are described herein provide integrated photonic devices with improved optical qualities.

There is therefore provided, in accordance with an embodiment of the invention, an optical device, including a first array of emitters disposed on a semiconductor substrate and configured to emit respective beams of optical radiation. A second array of micro-optics is positioned in alignment with the respective beams of the optical emitters and arranged to condition phases of the beams so that different ones of the beams are transmitted with different phase qualities.

In some embodiments, the emitters and micro-optics are configured so that the different ones of the beams are focused at different, respective distances from an edge of the semiconductor substrate. In some of these embodiments, the beams are focused to respective points along a locus having a predefined curvature. In a disclosed embodiment, the device includes collimation optics having a curved object plane, which coincides with the locus.

Additionally or alternatively, the emitters in the first array include respective spot-size converters. In some embodiments, the spot-size converters include tapered waveguides. In a disclosed embodiment, different ones of the spot-size converters have different, respective tapers selected so as to form spots of different, respective spot sizes. Additionally or alternatively, the tapered waveguides have respective output ends, which are offset relative to an output facet of the semiconductor substrate selected such that the output ends are disposed along a curve. In one embodiment, the spot-size converters are mutually non-parallel, so as to emit the respective beams in respective, non-parallel directions.

In some embodiments, the micro-optics in the second array include respective microlenses. In a disclosed embodiment, at least some of the microlenses are offset with respect to the respective beams so as to direct the beams at different, respective angles. Additionally or alternatively, at least some of the microlenses have different, respective focal lengths.

In a disclosed embodiment, the device includes one or more folding mirrors, which are disposed on the semiconductor substrate so as to direct the beams away from a plane of the semiconductor substrate.

There is also provided, in accordance with an embodiment of the invention, a light detection and ranging (LiDAR) system, including a transmitter, which includes a first array of emitters disposed on a semiconductor substrate and configured to emit respective beams of optical radiation and a second array of micro-optics positioned in alignment with the respective beams of the optical emitters and arranged to condition phases of the beams so that different ones of the beams are transmitted with different phase qualities. Collimating optics are configured to direct the beams transmitted by the micro-optics toward different, respective parts of a field of view of the LiDAR system in different, respective directions. A receiver is configured to receive reflections of the beams from the different parts of the field of view and to process the reflections in order to find distances to objects in the field of view.

In a disclosed embodiment, the emitters in the first array are configured to output the respective beams with different, respective spot sizes, which are selected so that the beams that are directed toward the different parts of the field of view have different, respective divergences.

There is additionally provided, in accordance with an embodiment of the invention, a method for producing an optical device. The method includes arranging a first array of emitters on a semiconductor substrate so as to emit respective beams of optical radiation. A second array of micro-optics is positioned in alignment with the respective beams of the optical emitters so as to condition phases of the beams so that different ones of the beams are transmitted with different phase qualities.

In some embodiments, positioning the second array includes arranging the micro-optics so as to focus the different one of the beams at different, respective distances from an edge of the semiconductor substrate, wherein arranging the micro-optics includes focusing the beams to respective points along a locus having a predefined curvature. Collimation optics are provided having a curved object plane, which coincides with the locus, and the method includes jointly optimizing an optical design of the collimation optics with optical properties of the emitters and the micro-optics.

The present invention will be more fully understood from the following detailed description of the embodiments thereof, taken together with the drawings in which:

DETAILED DESCRIPTION OF EMBODIMENTS

Overview

Typical arrays of laser emitters on a semiconductor substrate, such as one- or two-dimensional VCSEL arrays, emit beams in a direction normal to the substrate surface of the array. Design of beam conditioning or imaging lenses, for example to serve as collimation optics, to achieve the desired far-field illumination pattern must capture the angular emission of each array element (the NA, numerical aperture) emitted by all array elements, while also performing the imaging function for far-field spot position. Such designs typically require beams emitted from sources arranged in a telecentric configuration in object space. In this case, the lenses are designed for array element emission normal to the surface, followed either by focal or afocal image space, with the lenses designed to collimate each laser source to infinity (afocal), or to a finite working distance. Costly and complex lens systems may be required in order to achieve the desired beam quality. Similar limitations are encountered by linear (1D) arrays of edge-emitting lasers or photonic integrated circuit structures.

In embodiments of the present invention, integrated photonic devices provide the optical designer with additional optimizations through co-design of the integrated photonics elements and the collimation optics. These embodiments provide an optical device comprising an array of emitters disposed on a semiconductor substrate and configured to emit respective beams of optical radiation. An array of micro-optics, such as microlenses, is positioned in alignment with the respective beams of the optical emitters. The micro-optics condition the phases of the beams so that different beams are transmitted with different phase qualities. The term "phase qualities," as used in the context of the present description and in the claims, refers to focal and directional qualities of the beams, such as the spot size, divergence, numerical aperture, and chief ray direction.

In the embodiments described below, a photonic integrated circuit includes an array of emission apertures formed on a semiconductor substrate, with an array of waveguides on the substrate to guide light to or from other photonic circuit elements. The emission apertures are formed at the input/output surface of the photonic integrated circuit, and may be bidirectional, for example using polarization to split, transmit and receive light. The spot size of these output beams may be controlled by various classes of micro-optic and photonic components, such as spot-size converters on the photonic integrated circuit or a microlens array positioned in alignment with the respective output beams, or a combination of spot-size converters and a microlens array. In systems that are known in the art, however, when good beam quality is required, the design and production of the optics that follow the spot-size converters and/or microlens array are often complex and costly.

Embodiments of the present invention that are described herein address these problems by using an array of micro-optics, positioned in alignment with the respective beams of the optical emitters, so as to focus the beams so that different beams are transmitted with different phase quantities. The arrays of emitters and micro-optics may be either one- or two-dimensional arrays, depending on system requirements. The photonic integrated circuit containing the emitters and micro-optics may also contain other components, such as optical receivers, for example in a monostatic configuration together with the emitters.

In some embodiments, the emitters and microlenses are configured so that the beams are focused at different, respective distances from an edge of the semiconductor substrate, for example focused to respective points along a locus in space with a predefined radius of curvature. The curved object plane thus created can be co-optimized with the imaging or collimation optics in order to reduce the complexity of the optical design.

In some embodiments, micro-optics are arranged to provide vertical emission (normal or near-normal to the plane of the photonic waveguides).

Additionally or alternatively, the emitters and micro-optics are configured so that the different beams are focused to form spots of different, respective spot sizes. This approach is useful, for example, in a LiDAR system in which different beams are optimized for detection of objects at different distance ranges within the field of view of the system.

System Description

Figure 1A:
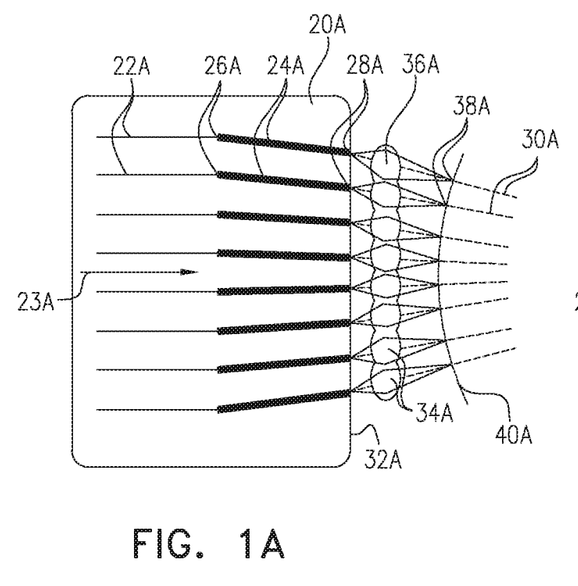
FIGS. 1A and 1B are respective schematic top views of edge-coupled photonic integrated circuits and respective microlens arrays, in accordance with two embodiments of the invention.
Figure 1B:
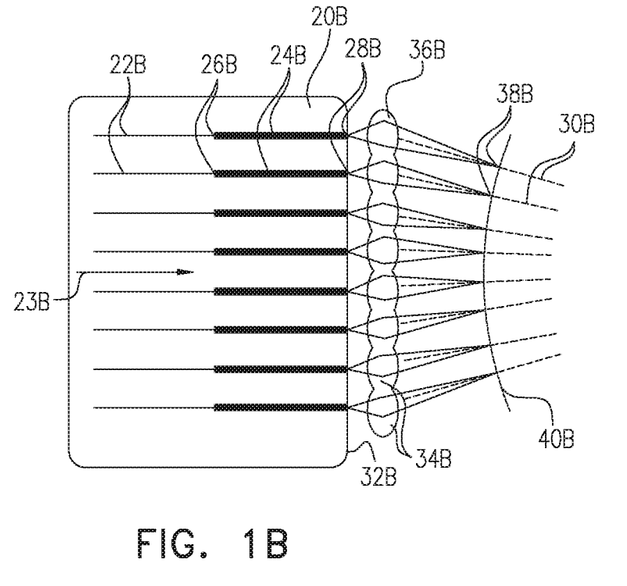

FIGS. 1A and 1B are respective schematic top views of edge-coupled photonic integrated circuits 20A and 20B with respective microlens arrays 36A and 36B, in accordance with two embodiments of the invention. The spatial mode of each output beam from photonic integrated circuits 20A and 20B (i.e., beam dimensions, divergence and direction) is set using micro-optics including an integrated spot-size converter 24A, 24B, realized within the photonic integrated circuit, and microlens array 36A, 36B, aligned externally with the photonic integrated circuit.

Photonic integrated circuits 20A and 20B comprise respective arrayed waveguides 22A and 22B, wherein guided optical signals propagate from left to right, as shown by respective arrows 23A and 23B. For the sake of simplicity, the circuitries of photonic integrated circuits 20A and 20B leading to arrayed waveguides 22A and 22B, respectively, are omitted from the description. These circuitries may include, for example, semiconductor lasers, which emit respective beams into the waveguides.

In the embodiment shown in FIG. 1A, photonic integrated circuit 20A comprises spot-size converters 24A, wherein each spot-size converter is optically coupled by its input end 26A to a respective waveguide 22A and receives optical radiation from the waveguide. Spot-size converters 24A are, through a lithographic fabrication process, configured to guide the optical radiation to their respective output ends 28A and to emit the optical radiation with a predefined spatial and angular distribution. Thus, each output end 28A may be regarded as an emitter of optical radiation or as an emission aperture from photonic integrated circuit 20A. (Similar considerations may be applied to the photonic integrated circuits in the embodiments below.) An example embodiment of spot-size converter 24A is a tapered coupler, similar to a spot-size coupler 106 with a tapered waveguide 122 in FIG. 2, below.

Furthermore, spot-size converters 24A are mutually non-parallel, so as to emit their respective beams in non-parallel directions. In the pictured example, converters 24A are angled so that the directions of "chief rays" 30A (the peak emission angle) for the optical radiation emitted by each spot-size converter can be controlled by lithographic definition of the waveguide. Specifically, angled design of spot-size converters 24A allows selection of the beam parameters, while the angles are not constrained to be normal to an output facet 32A of photonic integrated circuit 20A.

The radiation emitted from each output end 28A is received by a respective microlens 34A of microlens array 36A, wherein the microlenses are positioned so as not to cause any additional deviation of chief rays 30A. Alternatively, each microlens 34A may cause an additional angular deviation of respective chief ray 30A. Each microlens 34A is further positioned so that it images one of output ends 28A onto a respective point 38A on a curved locus 40A in space, wherein the locus may comprise a part of a circle, a part of a parabola, or a part of a more general curve. Microlenses 34A have different, respective effective focal lengths and thus re-image the flat output facet 32A of photonic integrated circuit 20A to a curved focal plane at locus 40A.

The radiation emitted from points 38A on locus 40A will be received by collimation optics to create a desired far-field illumination pattern (collimation optics are not shown in FIG. 1A). The angular orientations of chief rays 30A, as well as the curved shape of locus 40A, are utilized to simplify the design and construction of the collimation optics, as a telecentric and flat-field optical design is not required. For example, the collimation optics may be co-designed together with the design of photonic integrated circuit 20A for an optimal angular orientation of chief rays 30A and the shape of locus 40A.

In the embodiment shown in FIG. 1B, photonic integrated circuit 20B comprises spot-size converters 24B, which, similarly to spot-size converters 24A in photonic integrated circuit 24A, are coupled by their input ends 26B to respective waveguides 22B and receive optical radiation from the waveguides. Further similarly to spot-size converters 24A, spot-size converters 24B guide the optical radiation to their respective output ends 28B and emit the optical radiation with a predefined spatial and angular distribution. However, spot-size converters 24B are not angled with respect to waveguides 22B, but are rather aligned coaxially with the waveguides. Consequently, the direction of peak emission from each output end 28B is normal (perpendicular) to an output facet 32B.

The radiation emitted from each output end 28B is received by a respective microlens 34B of microlens array 36B. The centers of microlenses 34B for at least some of output ends 28B are offset (translated) relative to the center of the output end, so that each chief ray 30B exiting from respective microlens 34B is angled due to the specific offset of the microlens (rather than by the direction of spot size converters, as in photonic integrated circuit 20A). Similarly to photonic integrated circuit 20A, output ends 28B are focused onto points 38B on a curved locus 40B. Microlenses 34B have different, respective effective focal lengths and thus re-image the flat output facet 32B of photonic integrated circuit 20B to a curved focal plane at locus 40B. As in photonic integrated circuit 20A, the angular orientation of chief rays 30B, as well as the curved shape of locus 40B, may be utilized to simplify the optical design and the construction of the collimation optics.

Figure 2:
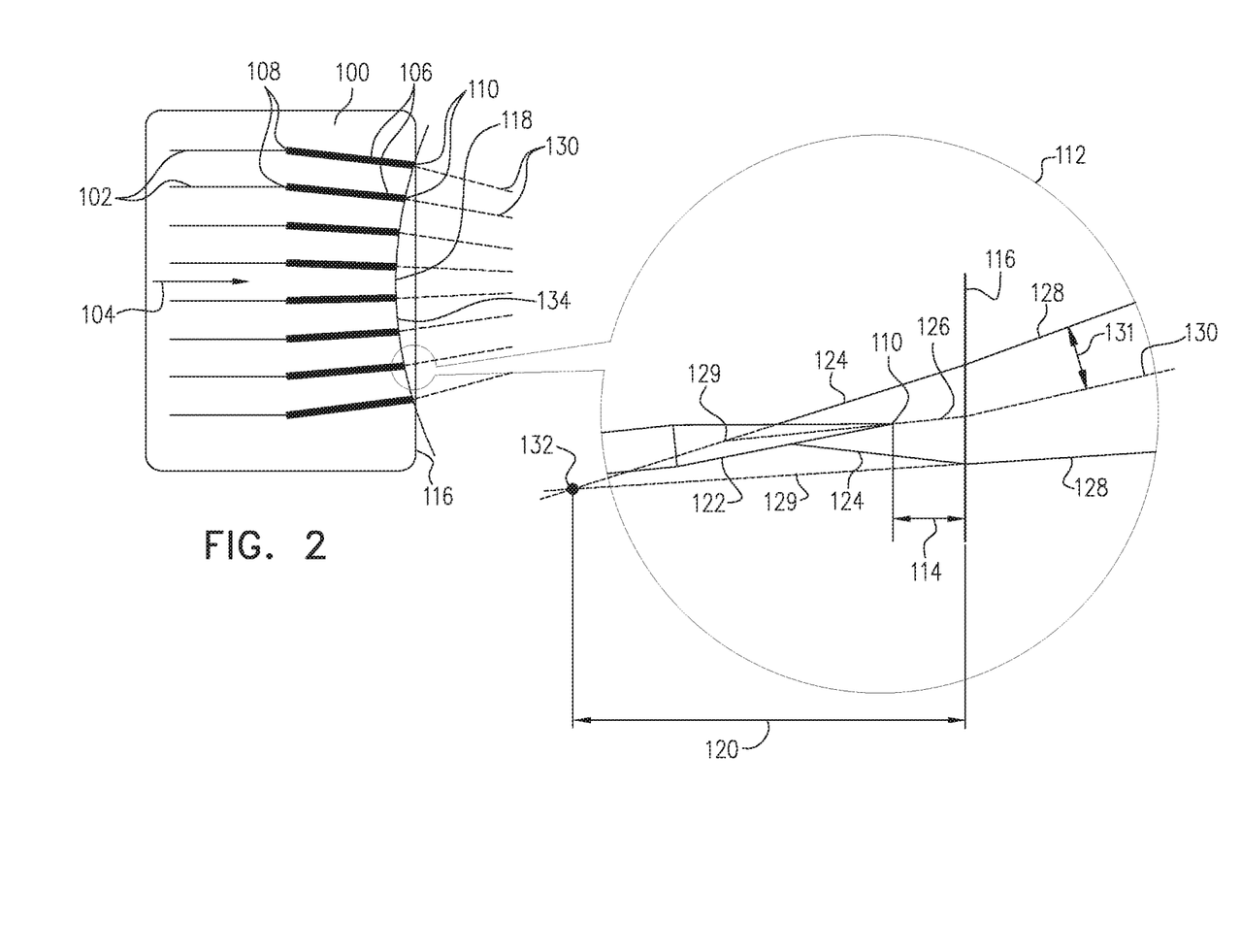
FIG. 2 is a schematic top view of a photonic integrated circuit with edge coupling, in accordance with another embodiment of the invention.

FIG. 2 is a schematic top view of a photonic integrated circuit 100 with edge coupling, in accordance with another embodiment of the invention.

Photonic integrated circuit 100 comprises, similarly to photonic integrated circuits 20A and 20B, arrayed waveguides 102, with guided optical signals propagating from left to right, as shown by an arrow 104. Photonic integrated circuit 100 further comprises, similarly to photonic integrated circuit 20A, angled spot-size converters 106, which are optically coupled to arrayed waveguides 102 by their input ends 108. Spot-size converters 106 guide the optical radiation to their respective output ends 110, and emit the optical radiation with a predefined spatial and angular distribution. As shown in detail in an inset 112, an offset 114 with respect to an output facet 116 is intentionally introduced in the fabrication of photonic integrated circuit 100 so that output ends 110 of spot-size converters 106 are disposed along a curve 118. An optical sag 120, as defined below, is realized, depending upon the material platform, by co-design of spot-size converters 106 and respective offsets 114 of their output ends 110 relative to facet 116.

In the pictured embodiment, output ends 110 comprise suitably tapered waveguides 122, which emit radiation into a cone described by optical rays 124 around a chief ray 126. Other shapes of output ends 110 may be used in alternative embodiments. The direction of each chief ray 126 is defined by the angled direction of the respective spot-size converter 106, and the angular extent of rays 124 is determined by the geometry of tapered waveguide 122. Rays 124 and chief ray 126 are refracted at facet 116 into rays 128 and into chief ray 130, respectively. A subtended half-angle 131 of the emitted radiation is defined by one of rays 128 and chief ray 130.

The extensions of rays 128 back into photonic integrated circuit 100, shown by dotted lines 129, define an apparent source point 132, whose distance from facet 116 defines optical sag 120. Apparent source points 132 formed by all spot-size converters 106 form a curved locus 134 (so close to curve 118 that it is not seen as a separate curve in FIG. 2). Similarly to photonic integrated circuits 20A and 20B, apparent source points 132 on locus 134, with their radiation propagating around refracted chief rays 130, form the sources for the subsequent collimation optics, with the curved shape of locus 134 and the angled directions of chief rays 130 relaxing the optical design considerations for the optics.

Figure 3A:
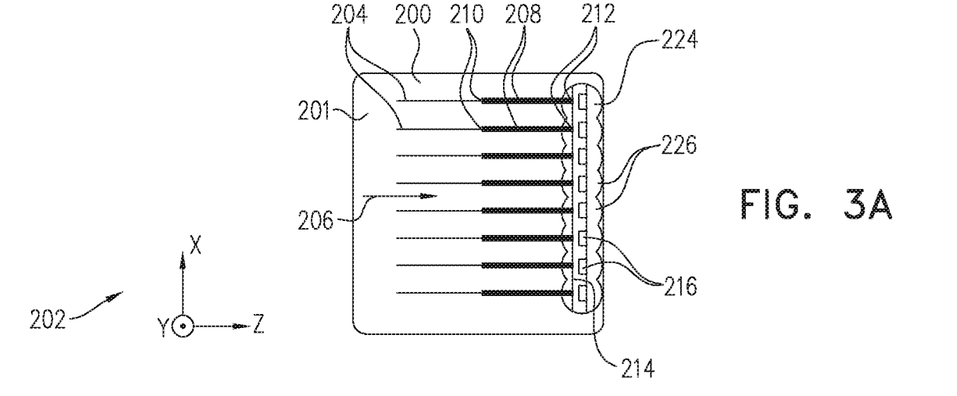
FIG. 3A is a schematic top view of a photonic integrated circuit with vertical coupling, in accordance with another embodiment of the invention.
Figure 3B:
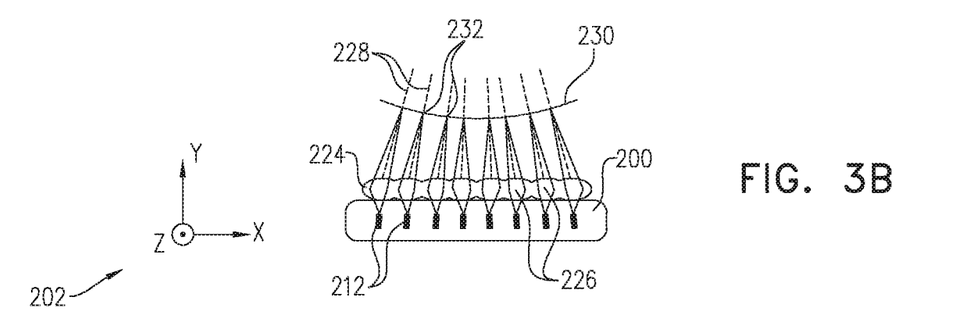
FIGS. 3B and 3C are schematic sectional views of the photonic integrated circuit of FIG. 3A.
Figure 3C:
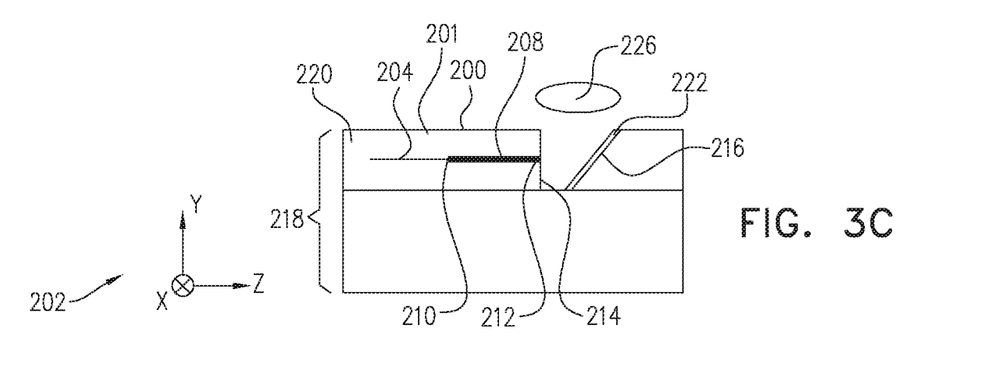

FIGS. 3A-3C schematically illustrate a photonic integrated circuit 200 with vertical coupling, in accordance with a further embodiment of the invention. For the sake of clarity, a Cartesian coordinate system 202 is shown next to each of FIGS. 3A-3C with an orientation appropriate to each figure. FIG. 3A is a top view, as viewed from the Y-direction down towards the XZ-plane, FIG. 3B is a sectional view taken along an XY-plane through a microlens array 224, and FIG. 3C is a sectional view taken along a YZ-plane through a waveguide 204 and a spot-size converter 208. By "vertical coupling" we mean that the direction of propagation of the radiation coupled out from photonic integrated circuit 200 forms a normal or near-normal angle with a top surface 201 of the photonic integrated circuit.

Photonic integrated circuit 200 comprises, similarly to photonic integrated circuits 20A and 20B, arrayed waveguides 204, with guided optical signals propagating from left to right, as shown by an arrow 206. Photonic integrated circuit 200 further comprises, similarly to photonic integrated circuit 20B, spot-size converters 208 collinear with arrayed waveguides 204. The spot-size converters are optically coupled to arrayed waveguides 204 by their input ends 210, guide the optical radiation to their respective output ends 212, and emit the optical radiation with a predefined spatial and angular distribution. Further similarly to photonic integrated circuit 20B, output ends 212 are located at an output facet 214.

In order to configure photonic integrated circuit 200 for vertical emission, a folding mirror 216 is disposed on a substrate 218 of the circuit opposite output ends 212 and direct the beams from output ends 212 away from a plane of the substrate. Folding mirrors 216 are formed on substrate 218 for example by cleaving or etching a silicon waveguide layer 220 and then coating the resulting diagonal surface with a reflective layer 222, as shown in FIG. 3C.

Array 224 of microlenses 226 is positioned above folding mirrors 216, with one microlens for each output end 212. Microlenses 226 are offset with respect to output ends 212, similarly to microlenses 34B in photonics integrated circuit 20B, so as to angle chief rays 228 exiting from each of the microlenses, and focus output ends 212 onto respective points 232 on a curved locus 230. Similarly to photonic integrated circuits 20A, 20B, and 100, apparent source points 232 on locus 230, with their radiation propagating around chief rays 228, form the sources for the subsequent collimation optics, with the curved shape of locus 230 and the angled directions of chief rays 228 relaxing the design considerations for the optics.

The configuration of folding mirrors 216 may be used in a similar fashion together with either of the architectures of photonic integrated circuits 20A and 100 for accomplishing vertical emission from the circuits.

Optical Design

Co-design of the optics of the photonic integrated circuits and the collimation optics makes it possible to reduce the lens count and complexity of the collimation optics. The designer has a large number of degrees of freedom at his disposal that can be used for designing the photonic integrated circuits and microlenses. For the design of the photonic integrated circuits, the degrees of freedom comprise, for example:

Spot size and numerical aperture (in two dimensions).
Position of the output ends of the spot-size converters, relative to array center, to compensate for optics distortion.
Emission angle.
Sag.

For the design of microlenses, the degrees of freedom comprise, for example:

Offset from aperture centroid or chief-ray.
Focal length and shape (spherical, aspheric or anamorphic).
Focus (re-image aperture vs. collimate).

Figure 4A:
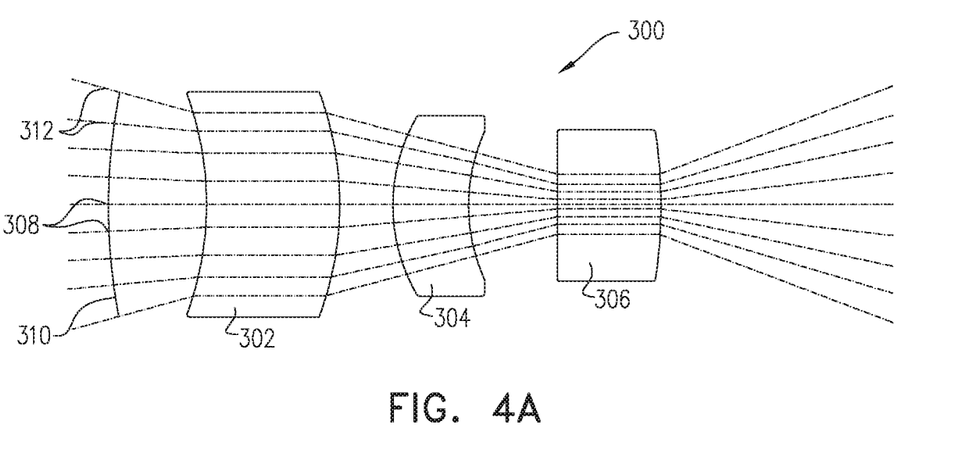
FIGS. 4A, 4B and 4C are schematic side views of collimation optics, in accordance with embodiments of the invention.
Figure 4B:
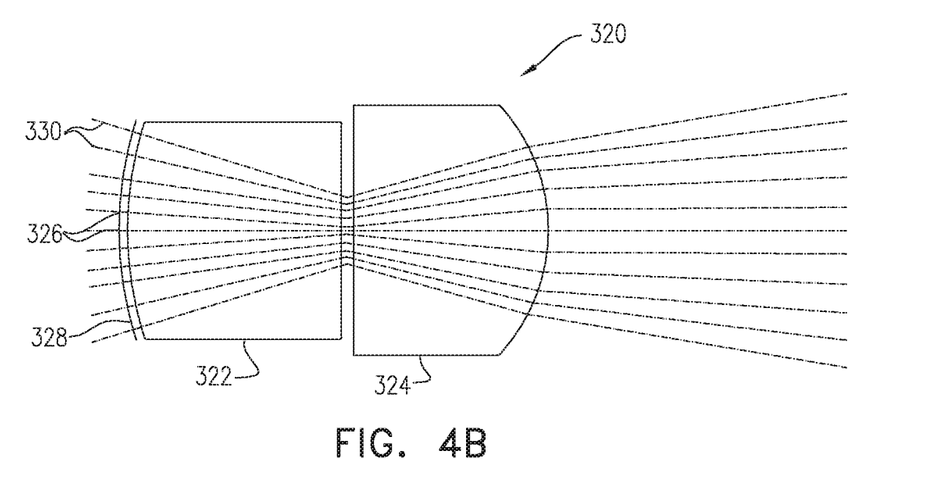
Figure 4C:
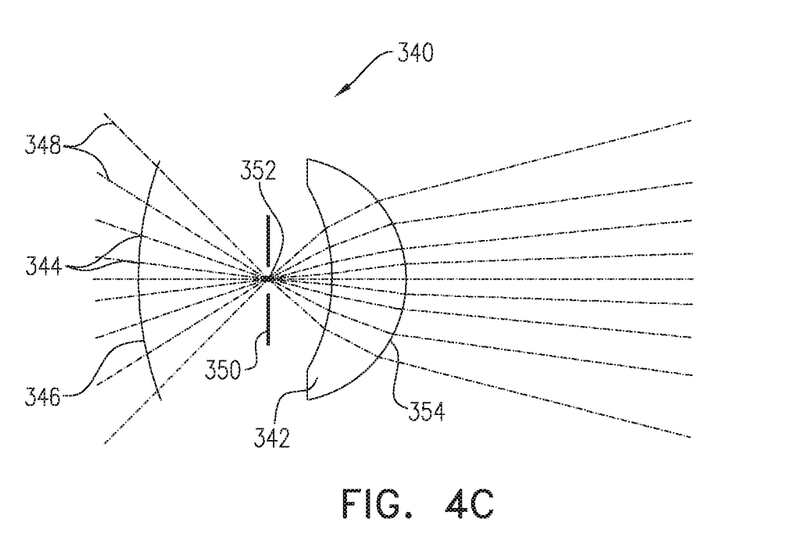

FIGS. 4A-4C are schematic side views showing three optical designs of collimation optics 300, 320, 340, respectively, in accordance with embodiments of the invention. The three optical designs take advantage of a curved source plane (curved locus of source spot images) and of angled chief rays provided by the design of the photonic integrated circuits and microlenses in the preceding embodiments. The curved source plane and the angled chief rays enable the design of collimation optics with fewer elements while maintaining near diffraction limited collimation of the beam sources ($M^2 \sim 1$).

Optics 300, in FIG. 4A, comprise three lenses 302, 304, and 306. A photonic integrated circuit (not shown in FIG. 4A) forms source points 308 of optical radiation on a curved locus 310, propagating along angled chief rays 312, as described above in reference to FIGS. 1-3. (In FIGS. 4A-4C only chief rays are shown. Other rays, such as marginal rays, are omitted for the sake of clarity.) The above-mentioned characteristics of the optical radiation received by optics 300 enable the optical design to achieve a nearly diffraction-limited performance, $M^2 \sim 1.0$, for all source points 308 on locus 310.

Optics 320, in FIG. 4B, comprise two lenses 322 and 324. A photonic integrated circuit (not shown in FIG. 4B) forms source points 326 of optical radiation on a curved locus 328, propagating along angled chief rays 330. These characteristics of the optical radiation received by optics 320 enable the optical design to achieve a nearly diffraction-limited performance, with $M^2 \approx 1.2$ for source points 326 at the edge of locus 328.

Optics 340, shown in FIG. 4C, comprise only a single lens 342. A photonic integrated circuit (not shown in FIG. 4C) forms source points 344 of optical radiation on a curved locus 346, propagating along angled chief rays 348. An aperture stop 350 is located at a center of curvature 352 of a second optical surface 354 of lens 342, thus minimizing the amount of coma introduced by the lens. Some residual astigmatism remains. The characteristics of the optical radiation received by optics 340, as well as the location of stop 350, enable the optical design to achieve a nearly diffraction-limited performance, with $M^2 \approx 1.4$ for source points 344 at the edge of locus 346.

The three optical designs 300, 320, and 340 may each be optimized to accommodate either a quadratic locus 230, 328, or 346, respectively, or a locus of higher order, such as $4^{th}$ degree, $6^{th}$ degree, or even higher.

FIGS. 5A-5I contain plots 410-492 of calculated far-field angular profiles for infrared optical radiation emitted by spot-size converters of various designs, in accordance with embodiments of the invention.

Using spot-size converter 106 of FIG. 2 as an example, the output spot size can be controlled by setting the width of the end of taper 122 to an appropriate value. The beam divergence typically decreases with increasing output spot size. For example, assuming spot-size converter 106 to be based on a silicon waveguide layer that is 220 nm thick, the spot size of an infrared beam guided through and output from the spot-size converter will increase as the width of the taper decreases below 160 nm, while the beam divergence angle decreases with increasing spot size.

Figure 5A:
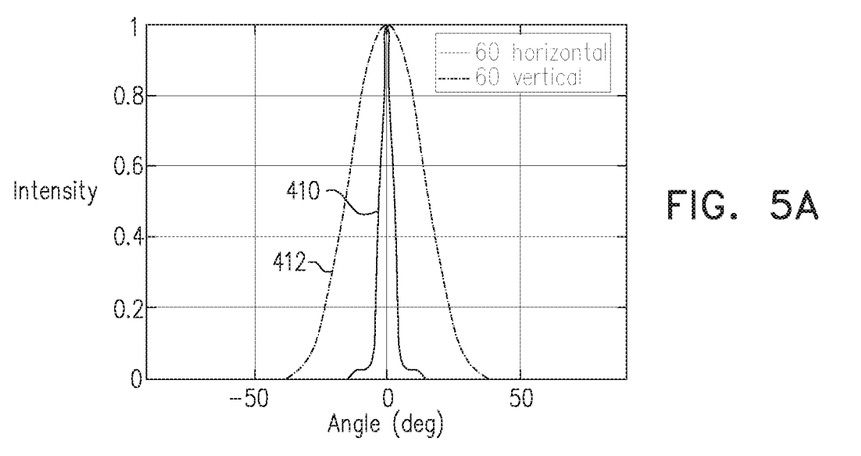
FIGS. 5A, 5B, 5C, 5D, 5E, 5F, 5G, 5H and 5I are schematic plots of far-field angular profiles for infrared optical radiation emitted by spot-size converters of various designs, in accordance with embodiments of the invention.
Figure 5B:
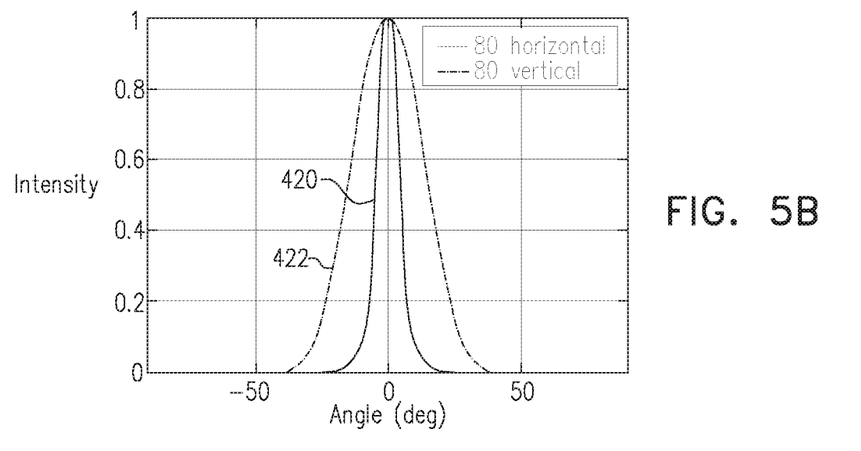
Figure 5C:
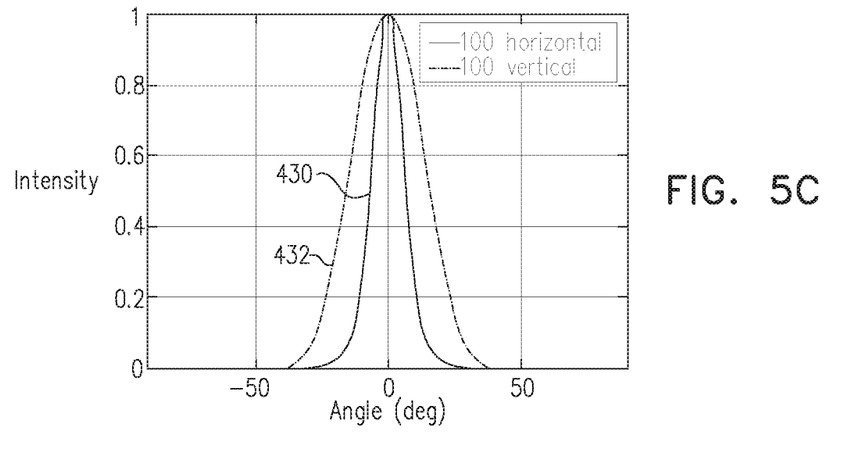
Figure 5D:
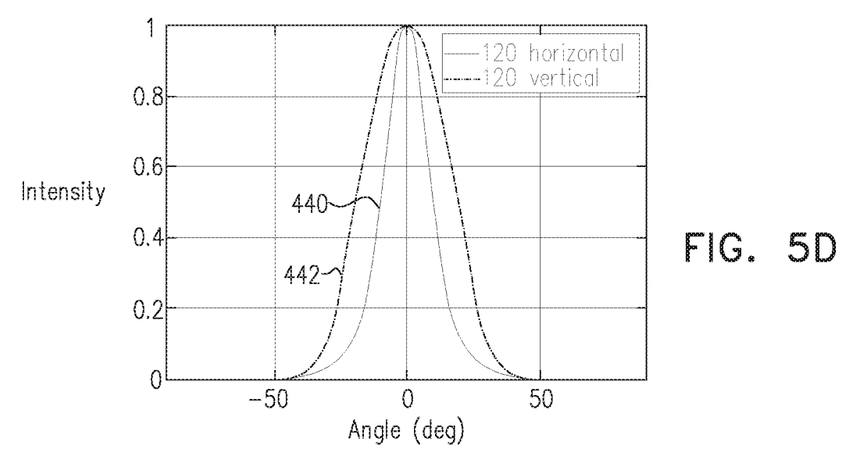
Figure 5E:
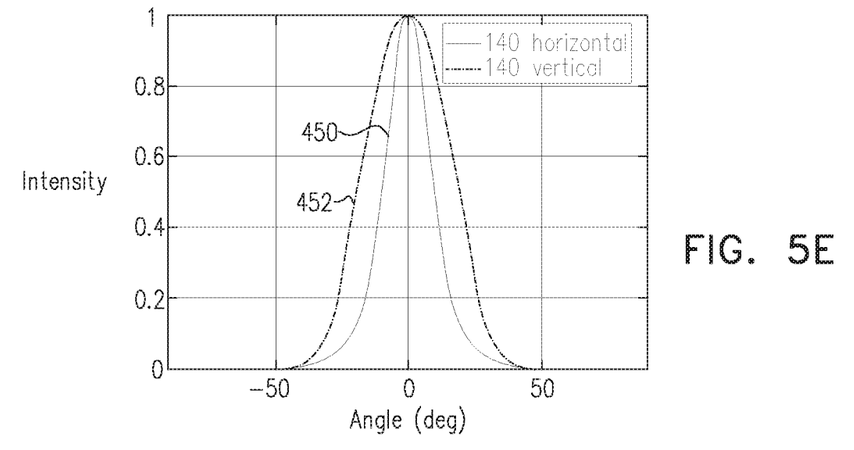
Figure 5F:
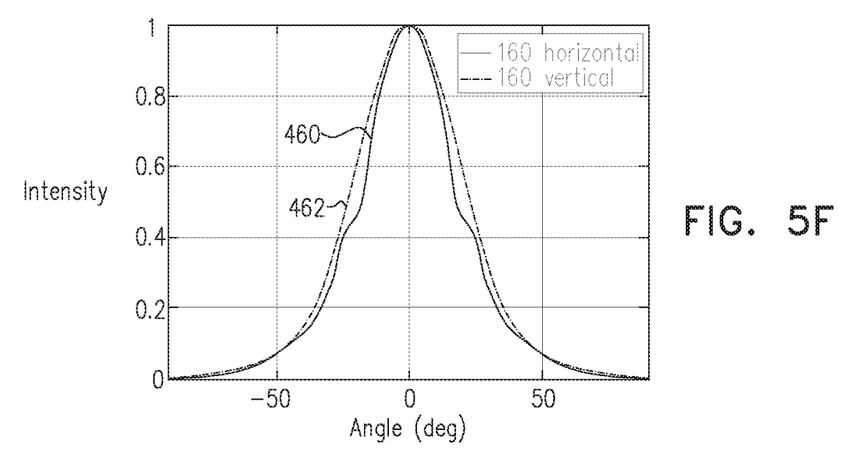
Figure 5G:
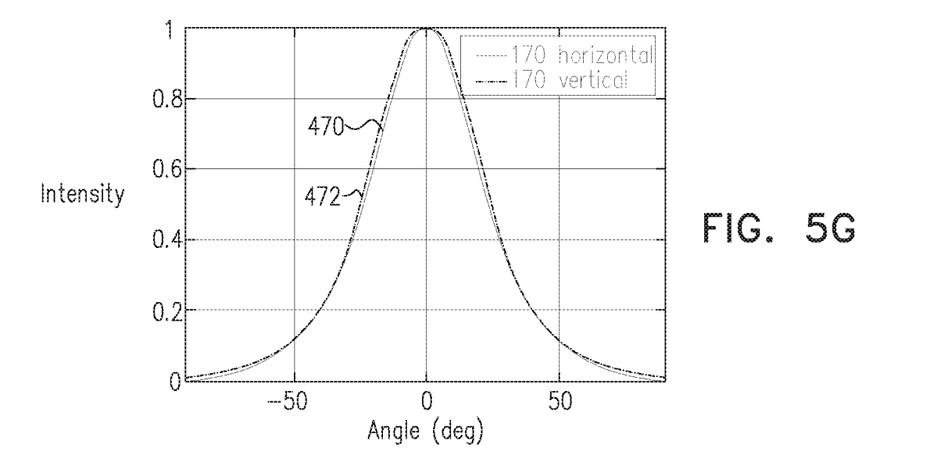
Figure 5H:
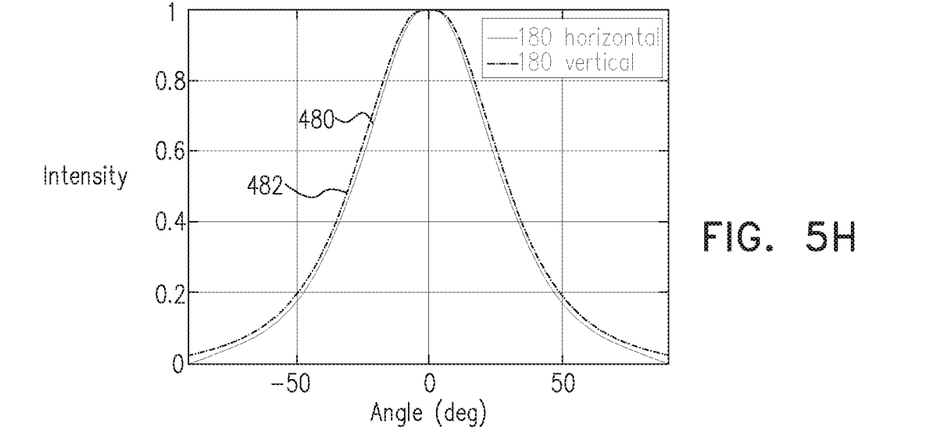
Figure 5I:
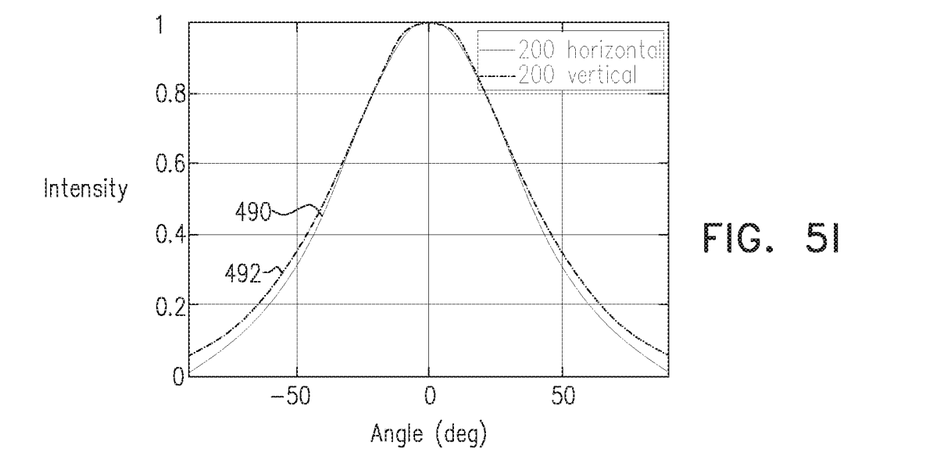

Plots 410-492 for the far-field angular profiles are calculated as a function of taper width, from a minimum of 60 nm in FIG. 5A to a maximum of 200 nm in FIG. 5I, for a wavelength of 1.55 μm. The plots show the far-field angular profiles in the vertical direction as solid lines and in the horizontal direction as dotted lines. The horizontal axis is the angular extent of the beam in degrees, and the vertical axis is the intensity of the beam in arbitrary units. The numbering of the graphs together with the taper widths are shown in Table 1, below.

TABLE 1

Plots of far-field angular profiles

| FIG. | Taper width (nm) | Graph for far-field angular profile | |
|---|---|---|---|
| | | Horizontal | Vertical |
| 5A | 60 | 410 | 412 |
| 5B | 80 | 420 | 422 |
| 5C | 100 | 430 | 432 |
| 5D | 120 | 440 | 442 |
| 5E | 140 | 450 | 452 |

TABLE 1-continued

Plots of far-field angular profiles

| FIG. | Taper width (nm) | Graph for far-field angular profile | |
|---|---|---|---|
| | | Horizontal | Vertical |
| 5F | 160 | 460 | 462 |
| 5G | 170 | 470 | 472 |
| 5H | 180 | 480 | 482 |
| 5I | 200 | 490 | 492 |

As may be seen from the plots, the horizontal angular extent varies from about ±5 degrees (FWHM) for a taper width of 60 nm to about ±40 degrees for a taper width of 200 nm, and the vertical angular extent varies from about ±20 degrees for the taper width of 60 nm to about ±40 degrees for the taper width of 200 nm.

Figure 6:
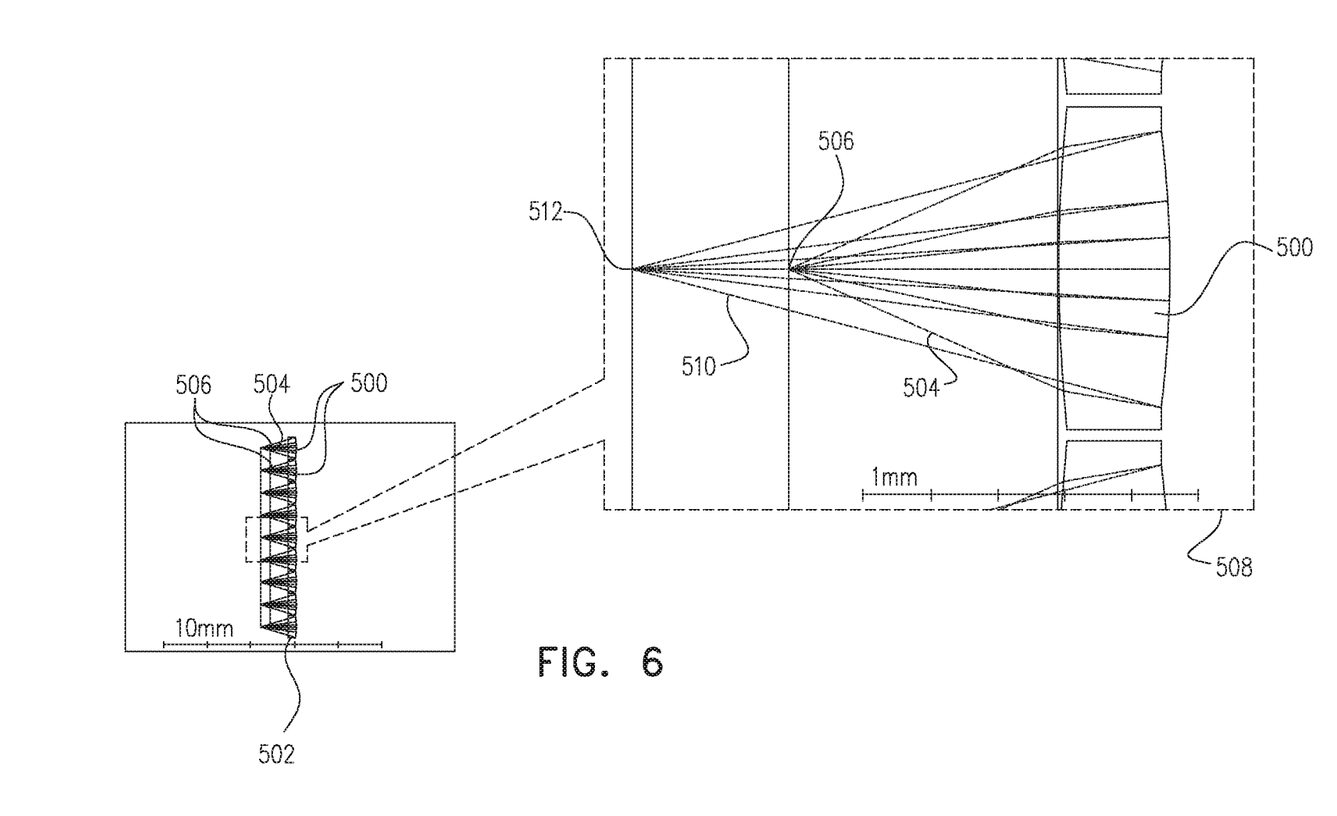
FIG. 6 is a schematic top view of a photonic integrated circuit and an associated microlens array, in accordance with an embodiment of the invention.

FIG. 6 is a schematic top view of output beams 504 from a photonic integrated circuit and an associated microlens array 502 for modifying the numerical aperture (NA) of the output beams, in accordance with an embodiment of the invention.

Microlenses 500 in microlens array 502 receive output beams 504, emitted by outputs 506 of a photonic integrated circuit (not shown in this figure), similarly to microlens array 36B in FIG. 1B (with the exception that the centers of the microlenses are aligned with the outputs.) As shown in more detail in an inset 508 and in FIGS. 7A-7B, microlens 500 reimages output 506 to form an output image 512 with a larger effective spot size and reduced NA (reduced from NA=0.4 for output beams 504 to NA=0.25 for imaged output beams 510). When used in conjunction with a collimating lens having an effective focal length of 20 mm, this design achieves low far-field divergence, with diffraction-limited performance ($M^2$=1.015).

Figure 7A:
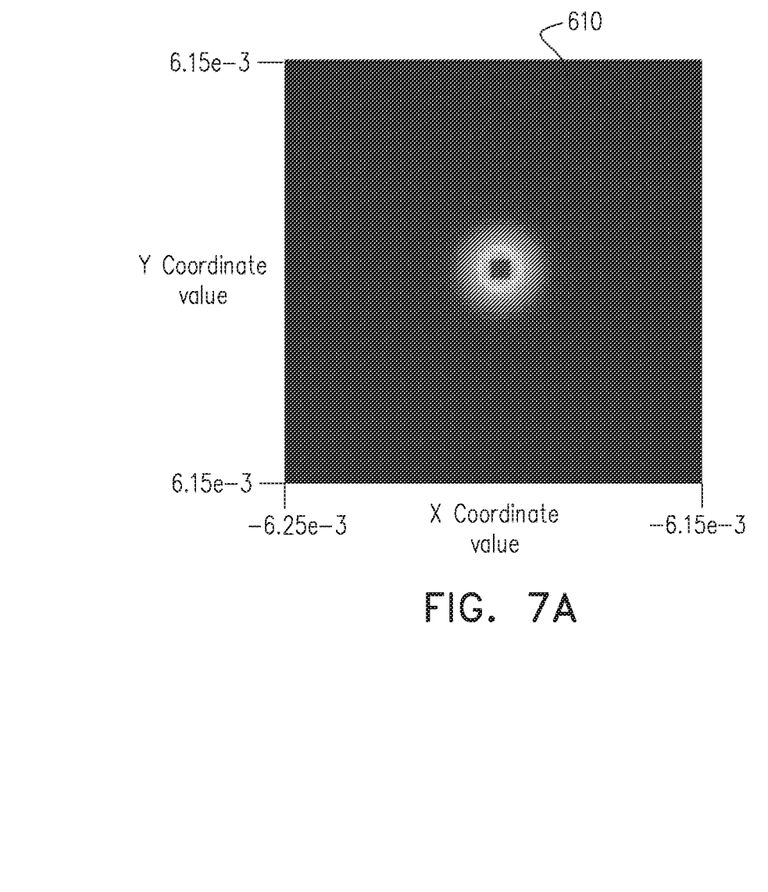
FIGS. 7A and 7B are graphical representations of the radiant emittances of an output of a beam before and after imaging with a microlens, respectively, in accordance with an embodiment of the invention.
Figure 7B:
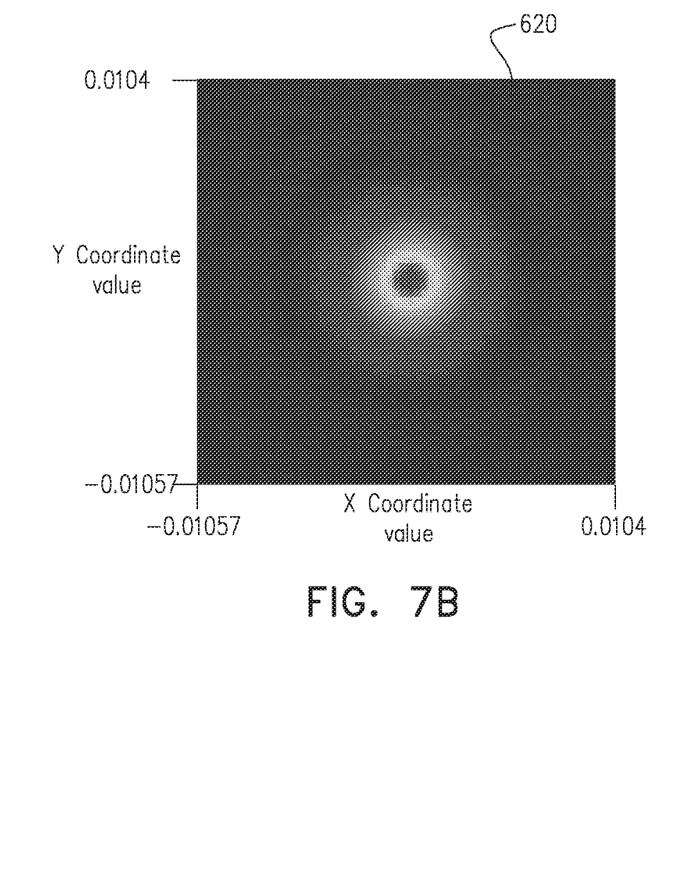

FIGS. 7A and 7B are graphical representations 610 and 620 of the radiant emittances of output 506 (before imaging with microlens 500) and output image 512 (after imaging with the microlens), respectively, in accordance with an embodiment of the invention. The x- and y-coordinates in representations 610 and 620 are shown in millimeters. The width of output 506 at 10% of maximum radiant emittance is approximately 2.7 μm, whereas the width of output image 512 at 10% of maximum radiant emittance is approximately 5.7 μm.

Lidar Applications

As noted earlier, the principles of the present invention may be used in optimizing characteristics of the laser beams used in LiDAR applications, and particularly in coherent LiDAR. For example, in a monostatic coherent LiDAR device, it may be necessary to trade off the beam size against the signal/noise ratio (SNR) as a function of range. The maximum range using a given set of beam parameters is the range at which an object can be detected reliably. The SNR is approximately the number of photons received from the target (for a coherent LiDAR). The maximum range can then be quantified as the farthest object distance at which the SNR is greater than a minimum threshold value for reliable detection, $SNR_{min}$. Assuming near diffraction-limited performance, the beam size and wavelength determine the angular far-field resolution. For a given transmit power and a Gaussian beam, a smaller beam diameter will result in higher SNR at short range, but faster degradation at longer ranges. Degraded beam parameters ($M^2$>1) reduce both range and resolution.

On this basis, it is possible to define an optimal beam size for any desired range. For example, a LiDAR channel with a required range of about 40 m will achieve the best SNR using a 10 mm beam ($M^2$=1) at the required range, whereas a channel with 200 m required range needs a 20 mm beam diameter ($M^2$~1) for optimal SNR.

Figure 8:
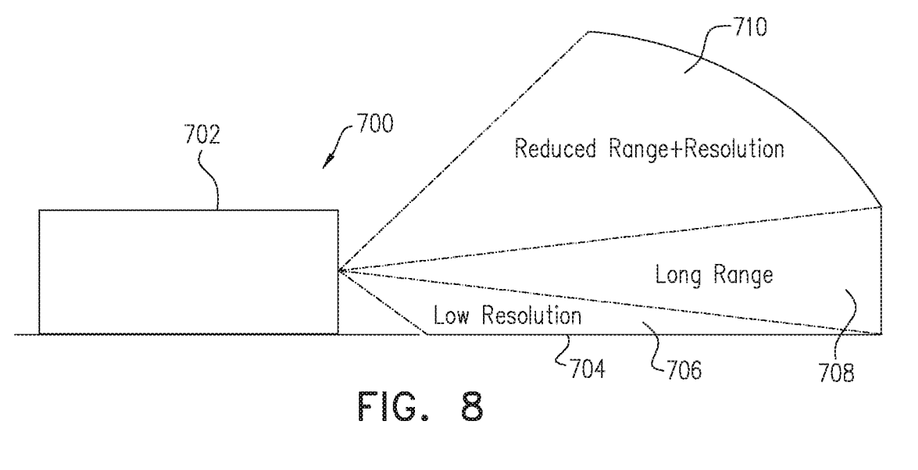
FIG. 8 is a schematic side view of a LiDAR system installed in a vehicle, in accordance with an embodiment of the invention.

FIG. 8 is a schematic side view of a LiDAR system 700 installed in a vehicle 702, in accordance with an embodiment of the invention. The beam parameters of LiDAR system 700 are set, using the principles of the previous embodiments, to provide a LiDAR system in which resolution and range vary over the field of view of the system. Automotive LiDAR applications, for example, can have variable range and resolution requirements across the vertical field of view:

a) Object detection on a road 704 in a range 706 can be optimized for short range and low resolution, favoring small beam diameter at the short range.

b) Detection of vehicles and other objects on the freeway in a range 708 should be optimized for long range and high resolution, calling for a larger beam diameter at the long range.

c) Detection of objects well above the horizon in a range 710 is of lower importance, and consequently only a reduced resolution and range are required.

These objectives can be realized using a multi-channel (array) implementation based on integrated photonics, with per-output optimization. This sort of multi-channel array can be integrated, for example, in the sorts of multi-beam LiDAR systems that are described in U.S. Provisional Patent Application 62/843,464, filed May 5, 2019, which is incorporated herein by reference. Multi-channel implementations are shown specifically in FIGS. 2-4 of this provisional application.

Figure 9:
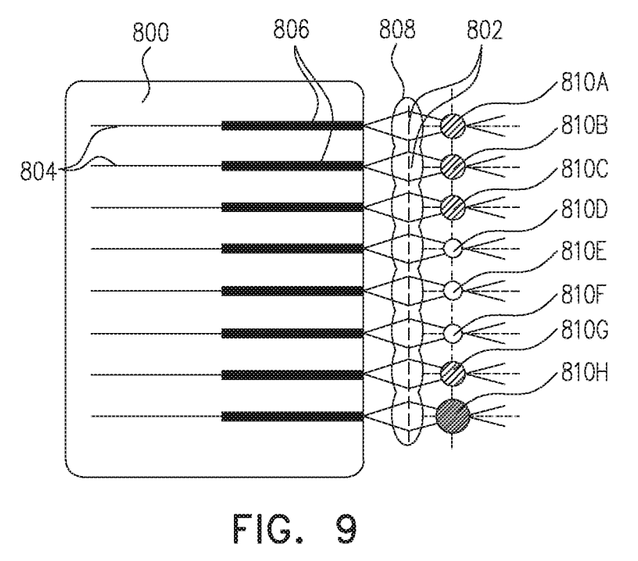
FIG. 9 is a schematic top view of a photonic integrated circuit and a microlens array for use in the system of FIG. 8, in accordance with an embodiment of the invention.

FIG. 9 is a schematic top view of a photonic integrated circuit 800 and a microlens array 808 that are designed to provide beams of different diameters to meet the range requirements of LiDAR system 700 (FIG. 8), in accordance with an embodiment of the invention. Photonic integrated circuit 800 and microlens array 808 serve as the transmitter for LiDAR system 700, emitting multiple beams of different diameters. A receiver (not shown) receives reflections of the beams from the different parts of the field of view that are shown in FIG. 8, and processes the reflections in order to detect the objects and find their respective distances from vehicle 702.

Photonic integrated circuit 800 comprises, similarly to, for example, photonic integrated circuit 20B (FIG. 1B), an array of waveguides 804 and a spot-size converter 806 for each waveguide. Microlenses 802 in array 808 are positioned with their centers aligned with respective output ends of spot-size converters 806. The optical radiation emitted by spot-size converters 806 is re-focused by respective microlenses 802 to form spots 810A, 810B, 810C, 810D, 810E, 810F, 810G, and 810H. The diameter of each of spots 810A-810H may be configured by an appropriate choice of the design parameters of spot-size converter 806 and microlens 802 (or other sorts of micro-optical component) forming the spot, as explained above.

The beam diameter and numerical aperture of each spot-size converter 806 can thus be optimized together with the corresponding microlens 802 to give beams that will have different spot sizes, even when used in conjunction with collimation optics having a fixed focal length for all beams. The collimation lens transforms the near-field spot size, i.e., the diameter of each of spots 810A-810H, following microlens 802 into a corresponding far-field beam divergence:

A small spot after microlens is transformed into a beam with a small divergence and a high intensity in the far field.

A large spot after microlens is transformed into a beam with a large divergence and a low intensity in the far field.

A medium spot after microlens is transformed into a beam with a medium divergence and a medium intensity in the far field.

Assuming the optics are designed to maintain separation between the channels in the vertical dimension, each channel can be optimized in this manner for short, medium or long range. In the present example, spots 810D, 810E, and 810F are small spots, projected by collimation optics into beams with a small divergence and a high intensity in the far field, and thus suitable for illuminating range 708 in FIG. 8. Spot 810H is a large spot, projected by collimation optics into a beam with a large divergence and low intensity in the far field, and thus suitable for illuminating range 706. Spots 810A, 810B, 810C, and 810G are medium-sized spots, and thus the beams projected by collimation optics from these spots satisfy the illumination requirements for range 710.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optical device, comprising:
   a first array of optical emitters, which are disposed on a semiconductor substrate and configured to emit respective beams of optical radiation, and which comprise respective spot-size converters; and
   a second array of micro-optics positioned in alignment with the respective beams of the optical emitters and arranged to condition phases of the respective beams so that different ones of the respective beams are transmitted with different phase qualities,
   wherein the respective spot-size converters are mutually non-parallel, so as to emit the respective beams in respective, non-parallel directions.

2. The optical device according to claim 1, wherein the respective spot-size converters comprise tapered waveguides.

3. The optical device according to claim 2, wherein different ones of the respective spot-size converters have different, respective tapers selected so as to form spots of different, respective spot sizes.

4. The optical device according to claim 2, wherein the tapered waveguides have respective output ends, which are offset relative to an output facet of the semiconductor substrate selected such that the respective output ends are disposed along a curve.

5. The optical device according to claim 1, wherein the micro-optics in the second array comprise respective microlenses.

6. The optical device according to claim 5, wherein at least some of the respective microlenses are offset with respect to the respective beams so as to direct the respective beams at different, respective angles.

7. The optical device according to claim 5, wherein at least some of the microlenses have different, respective focal lengths.

8. The optical device according to claim 6, and comprising one or more folding mirrors, which are disposed on the semiconductor substrate so as to direct the respective beams away from a plane of the semiconductor substrate.

* * * * *